US008854818B1

(12) United States Patent  
Angelucci

(10) Patent No.: US 8,854,818 B1  
(45) Date of Patent: Oct. 7, 2014

(54) RETAINING AND COOLING SYSTEM FOR LINE REPLACEABLE UNITS

(75) Inventor: Marc T. Angelucci, Cherry Hill, NJ (US)

(73) Assignee: Lockheed Martin Corporation, Bethesda, MD (US)

(*) Notice: Subject to any disclaimer, the term of this patent is extended or adjusted under 35 U.S.C. 154(b) by 188 days.

(21) Appl. No.: 13/524,307

(22) Filed: Jun. 15, 2012

(51) Int. Cl.
*H05K 7/20* (2006.01)

(52) U.S. Cl.
USPC ...... 361/707; 361/679.54; 361/704; 361/719; 361/720; 361/721; 165/80.2; 165/80.3; 165/104.33

(58) Field of Classification Search
USPC ........... 361/679.46–679.53, 688, 689, 361/704–712, 715–728; 165/80.2, 80.3, 165/80.4, 80.5, 104.33, 185; 24/523, 524, 24/456, 545; 29/428, 434, 436, 446, 29/890.03, 258, 244, 256, 253; 62/259.2; 257/706–727
See application file for complete search history.

(56) References Cited

U.S. PATENT DOCUMENTS

| 3,971,186 | A | | 7/1976 | Havelka et al. |
|---|---|---|---|---|
| 4,157,583 | A | * | 6/1979 | Basmajian et al. ........... 361/707 |
| 4,475,145 | A | * | 10/1984 | Heil et al. .................... 361/720 |
| 4,480,287 | A | | 10/1984 | Jensen |
| 4,484,381 | A | * | 11/1984 | Ellis et al. ...................... 24/523 |
| 4,819,713 | A | | 4/1989 | Weisman |
| 4,971,570 | A | | 11/1990 | Tolle et al. |
| 4,979,073 | A | * | 12/1990 | Husted ......................... 361/721 |
| 4,994,937 | A | | 2/1991 | Morrison |
| 5,036,428 | A | * | 7/1991 | Brownhill et al. ........... 361/721 |
| 5,402,319 | A | * | 3/1995 | Shumaker et al. ........... 361/796 |
| 6,246,582 | B1 | * | 6/2001 | Habing et al. ................ 361/704 |
| 6,721,182 | B1 | * | 4/2004 | Wells et al. .................. 361/704 |
| 7,212,409 | B1 | * | 5/2007 | Belady et ..................... 361/721 |
| 7,564,688 | B2 | * | 7/2009 | Li et al. ........................ 361/704 |
| 7,823,866 | B1 | * | 11/2010 | Pluymers et al. ....... 269/254 CS |
| 2007/0253169 | A1 | * | 11/2007 | Clawser ....................... 361/720 |
| 2008/0019102 | A1 | * | 1/2008 | Yurko .......................... 361/719 |
| 2008/0273302 | A1 | * | 11/2008 | Lin .............................. 361/687 |

* cited by examiner

*Primary Examiner* — Michail V Datskovskiy  
(74) *Attorney, Agent, or Firm* — Howard IP Law Group, PC

(57) ABSTRACT

A device for selectively clamping an electronic module to a heat sink comprising a frame and a camshaft rotatably attached to the frame. The camshaft comprises at least one cam lobe arranged thereon for selectively applying a clamping force on the electronic module in a direction generally normal to the heat sink.

18 Claims, 8 Drawing Sheets

RETAINING AND COOLING SYSTEM FOR LINE REPLACEABLE UNITS

FIELD OF THE INVENTION

The present invention relates to cooling and retaining systems for electronic components, and more specifically, to systems for cooling and retaining line-replaceable units (LRUs) including printed wire/circuit boards (PWBs/PCBs) or "circuit cards".

BACKGROUND

Modern electronic systems are often implemented using removable modules containing electronic components. These electronic modules, or LRUs, include printed wire/circuit boards (PWBs/PCBs) or "circuit cards", and provide quick replacement or repair, simplified system packaging and reduced cost. In some applications, these modules comprise high-power electronic components which generate large amounts of heat during operation. In order to prevent damage and extend the service life of these components, separate conductive cooling systems are often implemented into these systems. These cooling systems may comprise, for example, heat sinks or heat exchangers embodied as heat-conducting chasses or frames which may be air or liquid-cooled, or may simply comprise a large thermal capacity.

In traditional systems, LRUs are generally "edge-cooled", or held on their ends within slots formed on opposing "cold walls" or "cold plates" of a chassis. For example, FIG. 1 partially illustrates a cooling and retaining system 2 using traditional expanding card retainers in an edge-cooled configuration. The system includes a cooling chassis or cold wall 15 having a plurality of elevated wall sections 16 formed therein defining a plurality of slots. Edge-cooled units (e.g. LRUs) 17 are typically inserted into these cold wall slots, and clamped in place along their opposing edges via expanding "wedge locks" or "card retainers" 18. Such edge-cooled arrangements with card retainers suffer from several significant drawbacks. For example, cooling is relatively inefficient, as contact with the cold walls occurs only at the edges of the units. Moreover, the card retainers do not allow for easy extraction of the units, or the retainers themselves, because they often do not fully contract back to their non-expanded height, even when properly unlocked.

Alternative systems and methods are for LRU retention and cooling are desired.

SUMMARY

According to one embodiment, a device for selectively clamping an electronic module to a cooling surface of a heat sink is provided. The device includes a frame for attaching to a portion of the heat sink. At least one camshaft is provided which is rotatably attached to the frame. The camshaft includes at least one cam arranged thereon and configured to selectively generate a clamping force on the electronic module in a direction generally normal to the cooling surface of the heat sink.

A cooling and retaining system for one or more line replaceable units is also provided. The system includes a heat sink comprising an elongated planar cooling surface. A retaining device is attached to the elongated planar cooling surface of the heat sink, and configured to apply a force on a first side of the line replaceable unit, urging a second side of the line replaceable unit into contact with the elongated planar surface of the heat sink.

In another embodiment, a method for retaining an electronic module against a heat sink is provided. The method includes positioning a first generally planar surface of the module on a corresponding planar surface of a heat sink, and rotating at least one camshaft for applying a force on a surface of the electronic module opposite the first planar surface such that the force clamps the electronic module against the planar surface of the heat sink.

DETAILED DESCRIPTION

Figure 1:
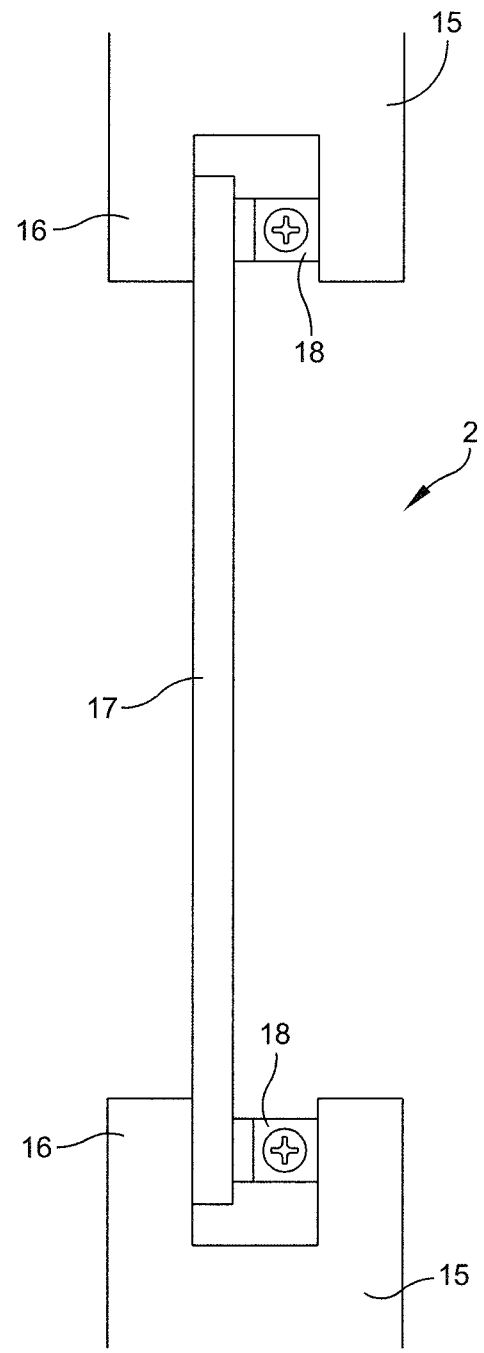
FIG. 1 is a front view of a retaining and cooling system according to the prior art showing an edge-cooled unit clamped between cold walls via card retainers.

It is to be understood that the figures and descriptions of the present invention have been simplified to illustrate elements that are relevant for a clear understanding of the present invention, while eliminating, for purposes of clarity, many other elements found in LRU retaining and/or cooling systems. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present invention include systems and methods for retaining and cooling LRUs including circuit cards, which offer improved mechanical and thermal characteristics compared to systems of the prior art. An exemplary LRU retaining and cooling system according to an embodiment of the present invention includes a retaining device configured to be mounted to, for example, a cold plate or heat sink of an LRU cooling system. Unlike traditional edge-cooled LRUs which are arranged generally perpendicular to opposing cold plates, embodiments of the present invention may be used to secure at least one side of an LRU to a parallel or coplanar surface of a cold plate. In this way, the surface area of the LRU in contact with the cold plate is greatly increased over arrangements of the prior art. In one embodiment, the retaining device may comprise a cam-activated arrangement for applying a clamping force in a direction generally perpendicular to the parallel surfaces of the LRU and the cold plate.

Figure 2A:
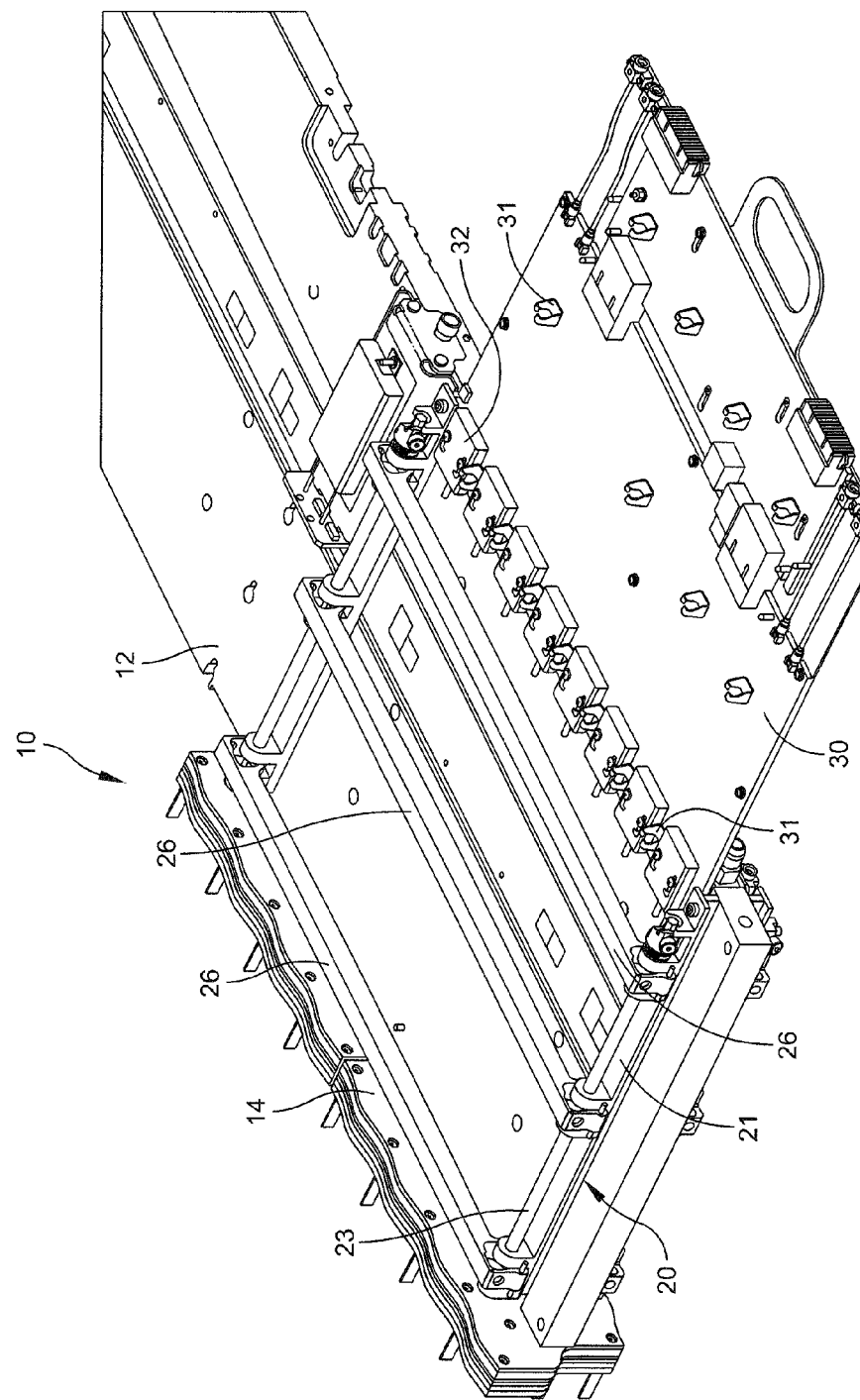
FIGS. 2A, 2B, and 2C are perspective views of an LRU retaining and cooling system according to an embodiment of the present invention, illustrating an LRU in an uninstalled position (FIG. 2A); and in an installed position (FIGS. 2B and 2C).
Figure 2B:
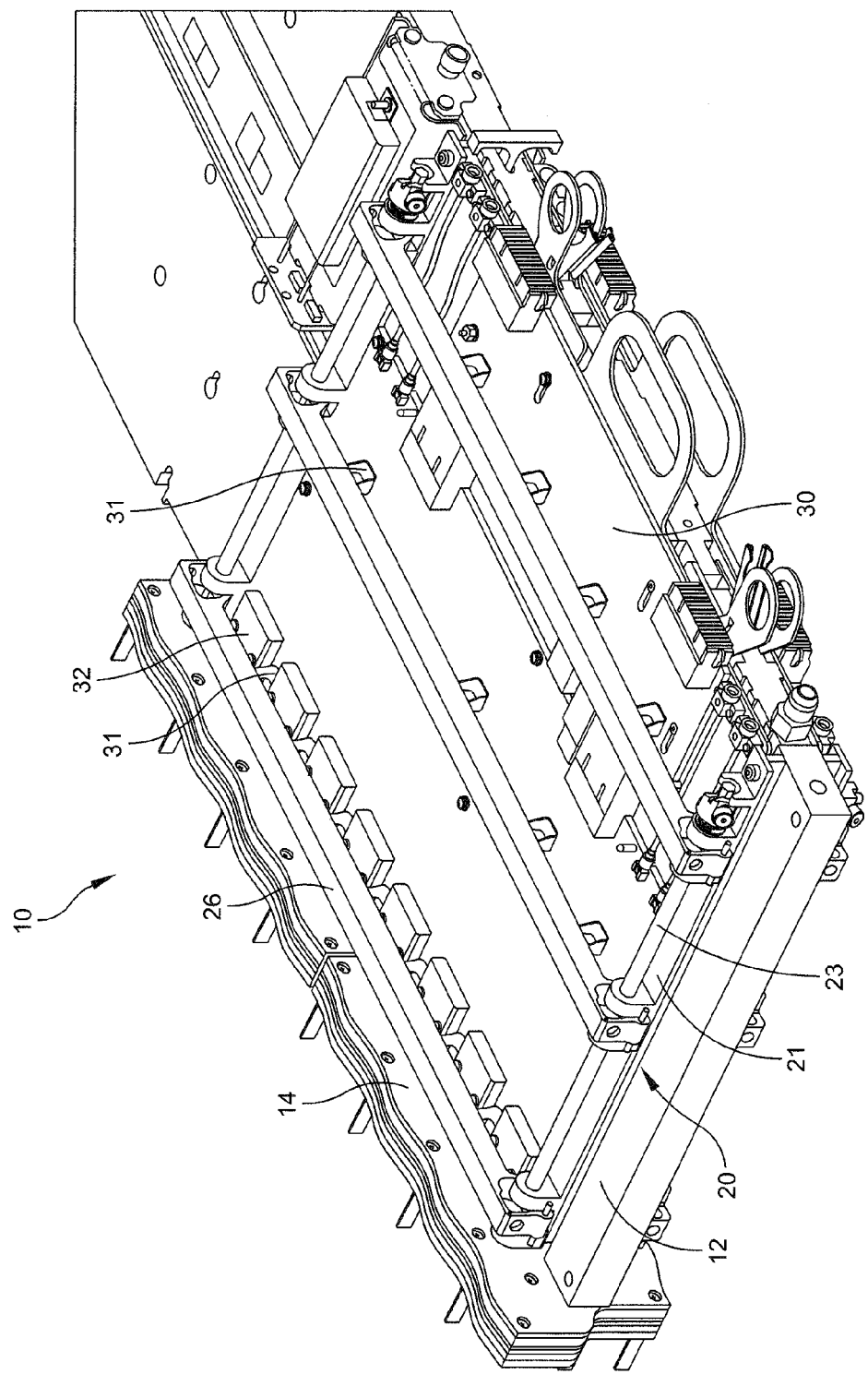
Figure 2C:
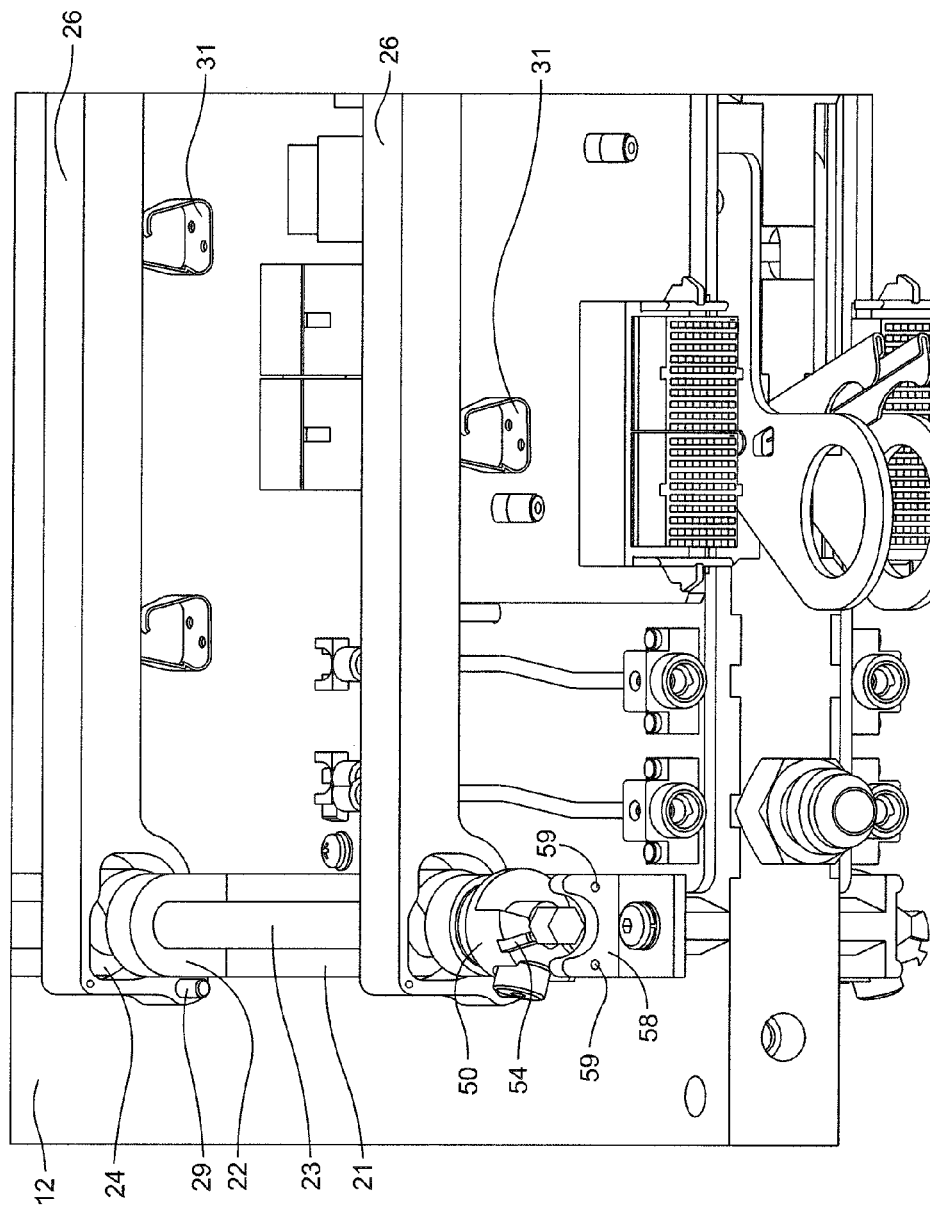

Referring generally to FIGS. 2A, 2B, and 2C, an exemplary LRU retaining and cooling system 10 is shown with an LRU 30 in an uninstalled position (FIG. 2A) and an installed position (FIG. 2B). In the exemplary embodiment, system 10 is implemented as a subassembly of a radar system. LRU 30 comprises a plurality of electronic components 32 (e.g. amplifiers) for interfacing with radiating elements 14 of the radar system. System 10 includes a heat sink, such as a liquid-cooled cold plate 12 used to cool LRU 30 once installed. Referring generally to FIG. 2B, in an installed position, LRU 30 is configured to be secured to a primary, elongated cooling surface of cold plate 12 which is generally co-planar with an underside of LRU 30. In this way, the surface area of LRU 30 in contact with cold plate 12 is enhanced (e.g. the entire underside of LRU 30 is in contact with cold plate 12), and thus, improved cooling is realized over the edge-cooled arrangements of the prior art illustrated in FIG. 1.

Still referring to FIGS. 2A-2C, one embodiment of the present invention includes a cam-activated clamping device 20 for securing LRU 30 to cold plate 12. As will be set forth in greater detail below with respect to FIGS. 3A-3D and 4A-4C, clamping device 20 may comprise one or more base members 21 attached to, for example, an exposed surface of cold plate 12. Base members 21 may be attached to cold plate 12 via any suitable means, such as mechanical fasteners, by way of non-limiting example. Clamping device 20 further comprises one or more pressure bars 26 configured to apply a force on LRU 30 in a direction generally normal to the co-planar surfaces of LRU 30 and cold plate 12. At least one rotatable camshaft 23 is provided for displacing pressure bars 26 in a direction generally normal to the surface of LRU 30 for generating this clamping force. In the illustrated embodiment, pressure bars 26 are configured to exert this force on a plurality of spring elements 31 arranged on LRU 30 (FIG. 3C).

Figure 3A:
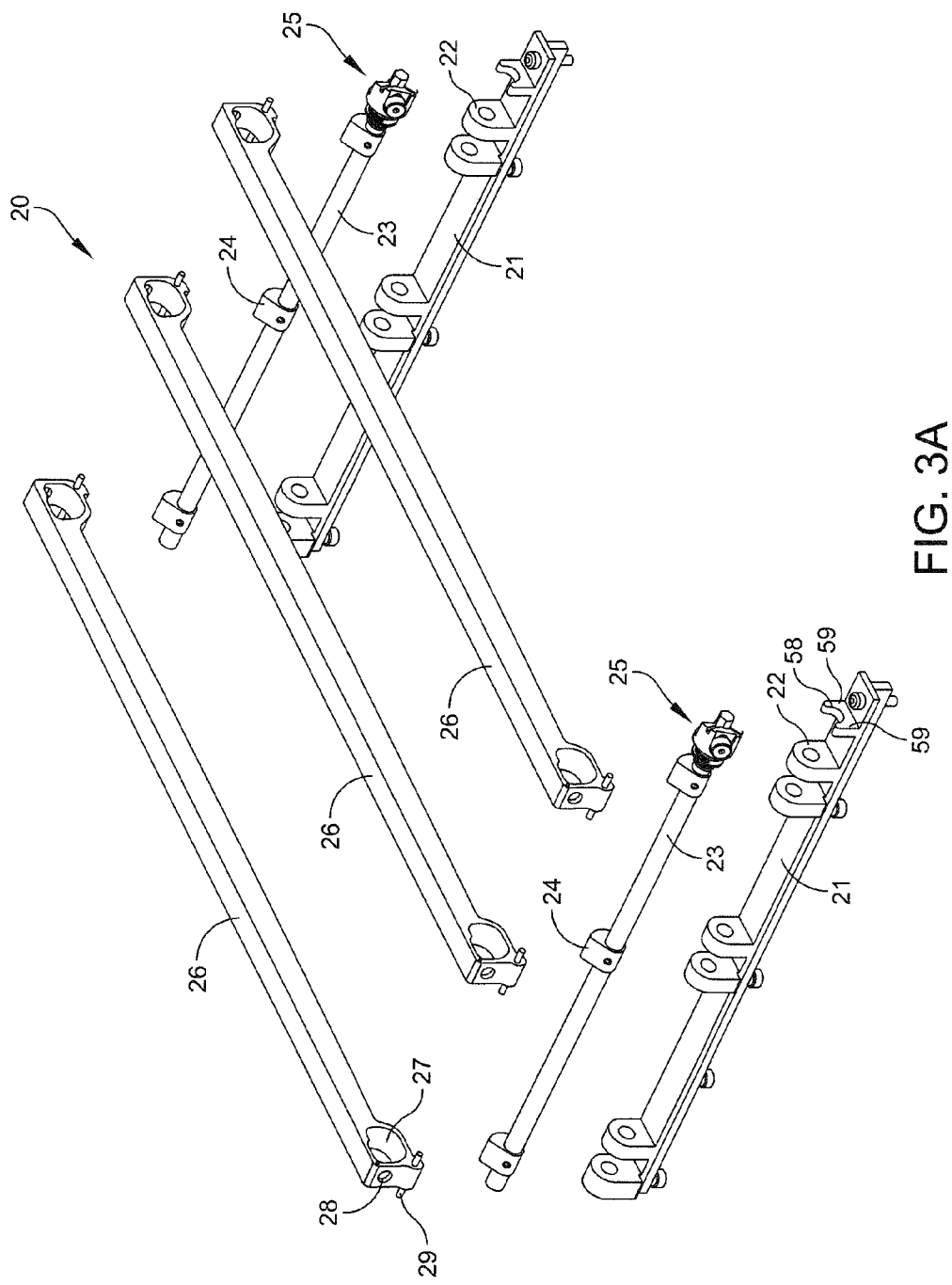
FIG. 3A is an exploded view of the LRU retaining device shown in FIGS. 2A, 2B, and 2C.

FIG. 3A is an exploded view of exemplary clamping device 20 of FIGS. 2A-2C. As set forth above, clamping device 20 comprises base members 21 for mounting to a portion of a cold plate or cold wall of a cooling system. In the exemplary embodiment, each base member 21 may comprise pairs of camshaft retainers 22 for rotatably supporting a corresponding camshaft 23. Each camshaft 23 comprises one or more cam lobes 24 arranged thereon. Cam lobes 24 are configured to be rotatably supported between each pair of retainers 22. Camshafts 23 and cam lobes 24 are operative to control the displacement of one or more pressure bars 26 with respect to base members 21. More specifically, pressure bars 26 comprise apertures formed on respective ends thereof defining cam following surfaces 27 for engaging with cam lobes 24. As shown in FIGS. 2A and 2B, these apertures are supported between each pair of retainers 22 and configured to accept or receive a respective cam lobe 24. Each end of a given pressure bar 26 may further include an element such as a pin 29 configured to prevent lateral displacement of pressure bars 26 with respect to base members 21 when in an installed position (FIG. 2C). As will be set forth in greater detail below, each camshaft 23 further comprises a locking assembly 25 configured to engage with a locking portion 58 formed on base member 21.

Figure 3C:
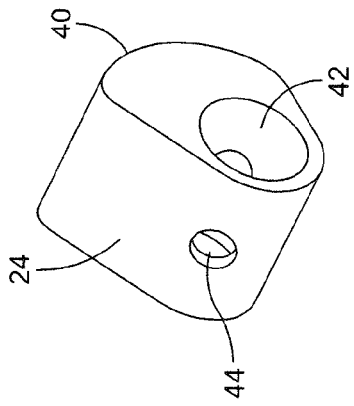
FIGS. 3B and 3C are front and perspective views, respectively, of a cam lobe of the retaining device of FIG. 3A.
Figure 3B:
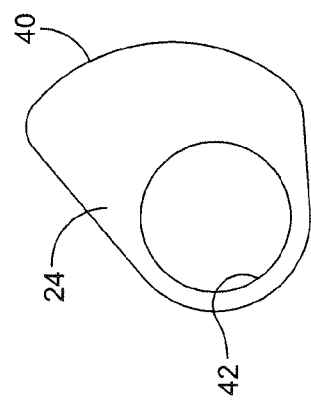

Referring generally to FIGS. 3B and 3C, each cam lobe 24 is configured to define therein an aperture 42 adapted to receive camshaft 23, and includes an outer cam surface 40 having a variable radius profile. Each cam lobe 24 may further include an aperture 44 formed therethrough for accepting a fastener for attaching cam lobe 24 to camshaft 23. Likewise, camshaft 23 may also include a corresponding aperture formed therethrough for accepting the fastener, while pressure bars 26 may have defined therein apertures 28 for accessing the fasteners in assembly/disassembly operations. While the illustrated embodiment discloses separate camshafts and attachable cam lobes, it should be understood that embodiments of the present invention may also utilize a single piece camshaft having lobes formed integrally thereon. In these embodiments, camshaft retainers 22 may comprise, for example, a two-part construction (e.g. a retaining base and a corresponding removable retaining cap) for facilitating installation and removal of camshaft 23 from base member 21.

Figures 4A, 4B, 4C:
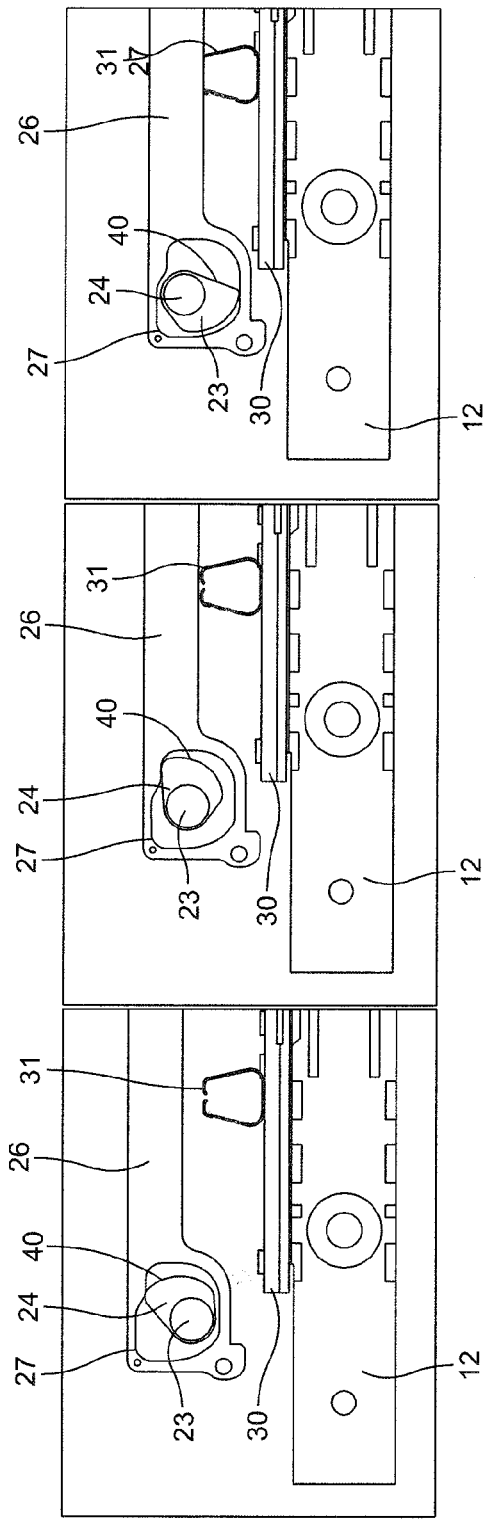
FIGS. 4A, 4B, and 4C are front views illustrating the clamping function of an LRU retaining device according to an embodiment of the present invention.

The operation of clamping device 20 according to embodiments of the present invention is described with reference to FIGS. 4A-4C. FIG. 4A illustrates clamping device 20 in an open, or unclamped position. More specifically, the angular orientation of camshaft 23 is such that a portion of outer surface 40 of cam lobe 24 with increased radius abuts a portion (e.g. a protruding portion) of cam following surface 27 of pressure bar 26. In this way, cam lobe 24 is operative to lift or displace pressure bar 26 in a direction generally away from the surface of LRU 30 and cold plate 12. In this unclamped position, no force is exerted on spring elements 31 by pressure bar 26, and LRU 30 is free to be inserted or removed from the system. As shown in FIG. 4B, clockwise rotation (e.g. about 35-45 degrees) of camshaft 23 allows pressure bar 26 to fall, or displace in a direction generally toward LRU 30 and cold plate 12. In this intermediate position, pressure bar 26 may come to rest on spring element(s) 31 arranged on LRU 30.

Referring generally to FIG. 4C, continued rotation of camshaft 23 displaces cam lobe 24 relative to cam following surface 27 of pressure bar 26 and urges pressure bar 26 further downward, against the opposing force generated by spring element(s) 31. In this installed or clamped position, LRU 30 is held in place via compressive force generated by pressure bars 26 (and spring element(s) 31) against cold plate 12. In the exemplary configuration, profiled surfaces 40 of cam lobes 24 and cam follower surfaces 27 of pressure bars 26 are shaped such that approximately 150 degrees of rotation of camshaft 23 displaces pressure bars 26 between the unclamped and clamped position. However, it should be understood that the amount of rotation of camshaft 23 required may be altered to, for example, control the amount torque needed to rotate the camshaft and/or control the desired displacement (e.g. lift) of the pressure bar relative to the surface of the LRU/cold plate.

Figure 3D:
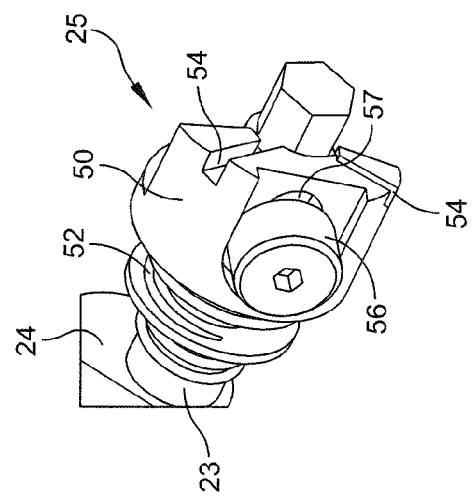
FIG. 3D is a perspective view of the camshaft locking arrangement of the retaining device of FIG. 3A.

With reference to FIG. 2C, as set forth above, rotation of camshaft 23 acts to lower pressure bars 26 against spring elements 31, compressing LRU 30 against cold plate 12. In the exemplary embodiments, the angular position of camshaft 23 may be fixed by locking mechanism 25. Locking mechanism 25 may provide for at least two fixed angular positions corresponding to, for example, the clamped and unclamped positions of pressure bars 26. This locking may be achieved by any number of means. For example, locking mechanism 25 may comprise a locking body 50 mounted to an end of camshaft 23. The angular orientation of locking body 50 may be fixed with respect to camshaft 23. Locking portion 58 of base 21 may be configured to hold pins 59 which are used to lock body 50 (and camshaft 23) with respect to base member 21. Referring generally to FIG. 3D, pins 59 (FIG. 2C) may be operative to engage with corresponding locking slots 54 formed in locking body 50. Locking body 50 may further comprise a slot 57 formed therein, with a set screw 56 arranged within slot 57 and attached to camshaft 23. Locking body 50 may be slidably arranged on camshaft 23, with its displacement limited by the length of slot 57. A spring 52 may be provided to bias locking body 50 into a locked position (i.e. bias body 50 and slots 54 towards pins 59). In operation, a user may urge locking body 50 against spring 52, sliding body 50 along camshaft 23, disengaging pins 59 from slots 54. With pins 59 disengaged, locking body 50 (and camshaft 23) may be rotated, for example, from an unclamped to a clamped position. Once the clamped position has been achieved, a user may release locking body 50, allowing spring 52 to urge locking body 50 toward locking portion 58, whereby pins 59 will engage with slots 54, locking camshafts 23 into an angular position with respect to base members 21. While an exemplary arrangement for locking the angular position of camshaft 23 has been described, it should be understood that embodiments of the present invention may utilize any suitable means to achieve this function. For example, complementary surfaces (e.g. a slot and a protrusion) in the cam lobe surface 40 and cam following surface 27 may be created such that the cam lobe may be secured in both a clamped and unclamped position without the need for a separate locking mechanism 25.

Figure 5:
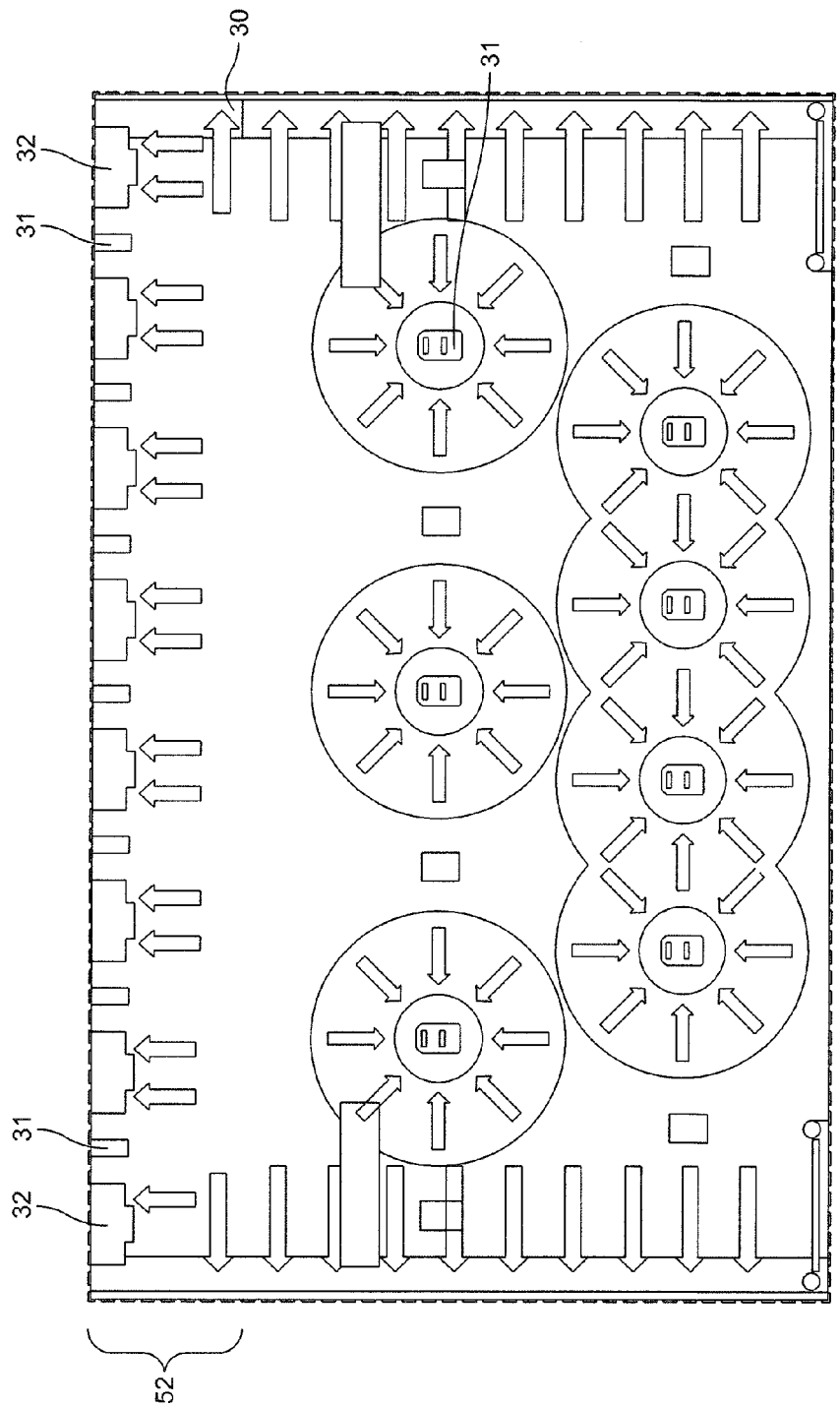
FIG. 5 is a top view of an LRU retaining device adapted to selectively distribute clamping force on the LRU.

Embodiments of the present invention provide several advantages over retaining systems of the prior art. For example, in addition to providing increased surface area for cooling between an LRU and a cold plate, the position of the pressure bars, cam lobes, and the spring elements may be tailored to specific applications for improving cooling efficiency. Referring again to FIGS. 2A and 2B, as will be understood by one of ordinary skill in the art, heat transfer efficiency between LRU 30 and cold plate 12 is partially a function of the contact pressure between LRU 30 and cold plate 12. Thus, the plurality of spring elements 31 may be intentionally positioned proximate (e.g. adjacent) components which produce significant heat output (e.g. high power amplifiers 32). In this way, embodiments of the present invention may target specific areas or components of LRU 30 for the application of increased pressure and thus increased cooling. FIG. 5 illustrates the results of such an arrangement, wherein the placement and characteristics (e.g. spring rate) of spring elements may 31 be tailored to provide increased pressure in areas of high heat generation, such as along edge section 52 which comprises a plurality of high-power amplifiers 32.

Embodiments of the present invention have been shown and described in only exemplary configurations, with many alternate arrangements contemplated and falling within the scope of the present invention. For example, while embodiments of clamping devices have been shown and described herein having two camshafts, one arranged generally on each side of an LRU to be secured, it is envisioned that embodiments of the present invention may also utilize, for example, a single camshaft arranged on one side of the clamping device, with an opposite side comprising a hinged or pivotable connection. In this way, rotation of the single camshaft may be used to pivot an end of one or more pressure bars around a pivot axis, clamping the LRU to the cold plate. Further, any number of pressure bars may be used, comprising any suitable size or shape. These bars may be supported by more than two base members and camshafts. The number, size and shape of the pressure bars (or any other system elements) may be configured to correspond to a particular LRU having a known component layout (and an accompanying known spring element layout), such that ideal clamping and cooling may be achieved for a number of different LRUs. Moreover, alternate embodiments of the present invention may eliminate the pressure bars entirely and may provide one or more camshafts arranged across the LRU (e.g. in the same general position of the illustrated pressure bars). In this way, one or more cam lobes of a camshaft may be used to apply pressure directly to the LRU (or to one or more springs elements).

While the spring elements are generally shown and described as being attached to an LRU, spring elements according to embodiments of the present invention may also be attached to the pressure bars. Further still, while the exemplary embodiments show spring members formed by, for example shaped sheet metal, it should be understood that any elastic material may be used in place of these spring members. It should be understood that, in addition to controlling the displacement of the pressure bars via the cam lobe profile, the clamping force generated by embodiments of the present invention may be controlled by altering the characteristics of any of these elastic elements. In one embodiment, the base members, camshafts, or the pressure bars may be elastically mounted, or comprise inherent elastic characteristics such that the spring elements shown throughout the figures may be removed, and the pressure bars configured to bear directly on an LRU.

Finally, in order to maintain accurate control over the clamping force generated on the LRU, embodiments of the present invention may include pressure bars which comprise a slightly curved or bowed profile. More specifically, when in a clamped position, the pressure bars set forth herein will be subject to their greatest deflection approximately midway along their length. This behavior may result in a reduction in force applied to the LRU in the area of deflection. By forming the pressure bar with an appropriate curvature (i.e. a curvature convex with respect to the exposed surface of the LRU), even pressure may be maintained on the LRU over the entire length of the pressure bar in a clamped position. Even pressure may also be achieved by varying the effective spring rates of the springs or elastic elements according to their position with respect to a given pressure bar.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A device for selectively clamping an electronic module to a heat sink comprising:
   a base member;
   a camshaft rotatably attached to the base member, the camshaft having at least one cam lobe arranged thereon; and
   a pressure bar operatively connected to the cam lobe of the camshaft,
   wherein rotation of the camshaft relative to the base member is operative to selectively apply pressure on the electronic module in a direction generally normal to the heat sink via the pressure bar.

2. The device of claim 1, wherein the pressure bar has an aperture formed on a first end thereof and configured to receive the at least one cam lobe.

3. The device of claim 2, wherein the pressure bar comprises a cam following surface formed on an inner surface thereof for interfacing with a corresponding surface of the cam lobe.

4. The device of claim 1, wherein the base member is configured to be attached to the heat sink.

5. The device of claim 1, wherein the pressure bar is configured to apply pressure to at least one spring arranged on a surface of the electronic device.

6. A device for selectively clamping an electronic module to a heat sink comprising:
   a first base member and a second base member;
   a first camshaft rotatably attached to the first base member and a second camshaft rotatably attached to the second base member, the first and second camshafts each having at least one cam lobe arranged thereon;
   wherein rotation of the first and second camshafts relative to the first and second base members is operative to selectively apply pressure on the electronic module in a direction generally normal to the heat sink.

7. The device of claim 6, wherein the pressure bar is arranged between the first base member and the second base member.

8. The device of claim 7, wherein the pressure bar has an aperture formed on each of a first and second end thereof, the apertures configured to receive the cam of the first and second camshafts therein.

9. The device of claim 8, wherein each of the first and second camshafts comprises a plurality of cams, and wherein the pressure bar comprises a plurality of pressure bars, each pressure bar arranged between a corresponding pair of cams on the first and second camshafts.

10. The device of claim 1, further comprising a locking mechanism configured to fix the angle of rotation of the camshaft with respect to the base member.

11. The device of claim 10, wherein the locking mechanism comprises a locking body slidably arranged on the camshaft and configured to selectably engage with a portion of the base member.

12. A system comprising:
   a heat sink having at least one elongated planar cooling surface;
   a line replaceable unit having a first side and a second side;
   a retaining device comprising:
      a base member; and
      a camshaft rotatably attached to the base member, the camshaft comprising at least one cam lobe arranged thereon;
   wherein rotation of the camshaft with respect to the base member is operative to apply a force on a first side of the line replaceable unit, urging the line replaceable unit into contact with the at least one elongated planar cooling surface of the heat sink.

13. The system of claim 12, further comprising a pressure bar operatively connected to the cam lobe of the camshaft, wherein the pressure bar is configured to apply the force on the first side of the line replaceable unit.

14. The system of claim 13, further comprising at least one spring arranged between the pressure bar and the first side of the line replaceable unit, wherein the force applied by the pressure bar is applied to the at least one spring.

15. The system of claim 14, wherein the first side of the line replaceable unit has a plurality of electrical components arranged thereon, and wherein the at least one spring comprises a plurality of springs, wherein at least a portion of the plurality of springs are arranged on the first side of the line replaceable unit adjacent at least a portion of the plurality of electrical components.

16. A method for retaining an electronic module against a heat sink comprising:
   abutting a first generally planar surface of an electronic module against a corresponding planar surface of a heat sink;
   applying a force to a surface of the electronic module opposite the first planar surface to retain the electronic module against the heat sink;
   wherein the force is applied via rotation of at least one camshaft having at least one cam lobe.

17. The method of claim 16, wherein the step of applying a force to the surface of the electronic module comprises clamping the electronic module against the heat sink.

18. The method of claim 17, further comprising locking the at least one camshaft in a fixed position after said rotation.

* * * * *